United States Patent
Eaton et al.

(10) Patent No.: US 6,704,556 B1
(45) Date of Patent: Mar. 9, 2004

(54) COMMUNICATION DEVICE UTILIZING CHANNEL BASED OSCILLATOR AGING COMPENSATION AND METHOD THEREFOR

(75) Inventors: Eric Thomas Eaton, Lake Worth, FL (US); David Jeffery Hayes, Lake Worth, FL (US); Von Alan Mock, Boynton Beach, FL (US)

(73) Assignee: Motorola Inc., Schaumburg, IL (US)

( * ) Notice: Subject to any disclaimer, the term of this patent is extended or adjusted under 35 U.S.C. 154(b) by 471 days.

(21) Appl. No.: 09/668,573

(22) Filed: Sep. 25, 2000

(51) Int. Cl.[7] .............................................. H04B 1/06
(52) U.S. Cl. .................... 455/260; 455/192.2; 455/255; 455/259
(58) Field of Search ........................... 455/192.1, 192.2, 455/255, 256, 257, 259, 260, 67.11, 226.1, 226.2; 375/344; 331/34

(56) References Cited

U.S. PATENT DOCUMENTS

| | | | |
|---|---|---|---|
| 4,901,036 A | | 2/1990 | Herold et al. |
| 5,109,544 A | * | 4/1992 | Mittel et al. ............. 455/182.2 |
| 5,115,515 A | * | 5/1992 | Yamamoto et al. ........... 455/71 |
| 5,493,710 A | * | 2/1996 | Takahara et al. ......... 455/192.2 |
| 5,566,213 A | * | 10/1996 | Carsello ..................... 375/344 |
| 5,625,351 A | | 4/1997 | Willard et al. |
| 6,108,525 A | * | 8/2000 | Takemura ................ 455/67.14 |

* cited by examiner

Primary Examiner—Quochien B. Vuong
(74) Attorney, Agent, or Firm—Sylvia Chen; Randall S. Vaas (57) ABSTRACT

A communication device (100) and method therefore for compensating an oscillator (146). The communication device (100) includes a receiver (110) for receiving message information transmitted on a predetermined channel (105), an oscillator (146) having a frequency of operation set by a controller (116) for enabling reception of the message information on the predetermined channel (105), and a decoder (114) for decoding the message information received, and for deriving there from messages and channel quality information. The controller (116) is responsive to the messages derived, for storing the same, and further responsive to the channel quality information derived for generating a compensation signal when the value of the channel quality information exceeds a predetermined value. The compensation signal that is generated by the controller (116) effects shifting of the frequency of operation of the oscillator (146) to center reception of the communication device (100) on the predetermined channel (105).

22 Claims, 5 Drawing Sheets

COMMUNICATION DEVICE UTILIZING CHANNEL BASED OSCILLATOR AGING COMPENSATION AND METHOD THEREFOR

BACKGROUND OF THE INVENTION

1. Field of the Invention

This invention relates in general to communication devices having an oscillator, and more specifically to a communication device having channel based oscillator aging compensation.

2. Description of the Related Art

Communication devices, such as cellular telephones, pagers, and fixed station transceivers are widely used today. All such communications devices share one common problem, over time drift of the oscillator which controls channel frequency, can lead to unintelligible communications, and in the extreme, complete failure to receive information being transmitted over a radio frequency channel. This problem is especially problematic for communication devices used in unattended locations that are used to provide remote monitoring of operating equipment or to provide security for a facility. As a result, such communication devices have to be periodically checked by a trained serviceman, and the oscillator retuned, should the oscillator have drifted off frequency. The problem can be alleviated to some extent through the used of high stability oscillators, which would extended the time interval between which checking the oscillator is performed, but such oscillators are often costly, and do not necessarily justify the added expense to the communication device.

What is needed is a method and apparatus by which communication devices having relatively low stability oscillators can be regularly adjusted without the intervention of the user of the device.

DESCRIPTION OF THE DRAWINGS

The features of the invention which are believed to be novel are set forth with particularity in the appended claims. The invention itself may be best understood by reference to the following description when taken in conjunction with the accompanying drawings, in the several figures of which like reference numerals identify identical elements, in which, and wherein:

DETAILED DESCRIPTION OF THE INVENTION

Figure 1:
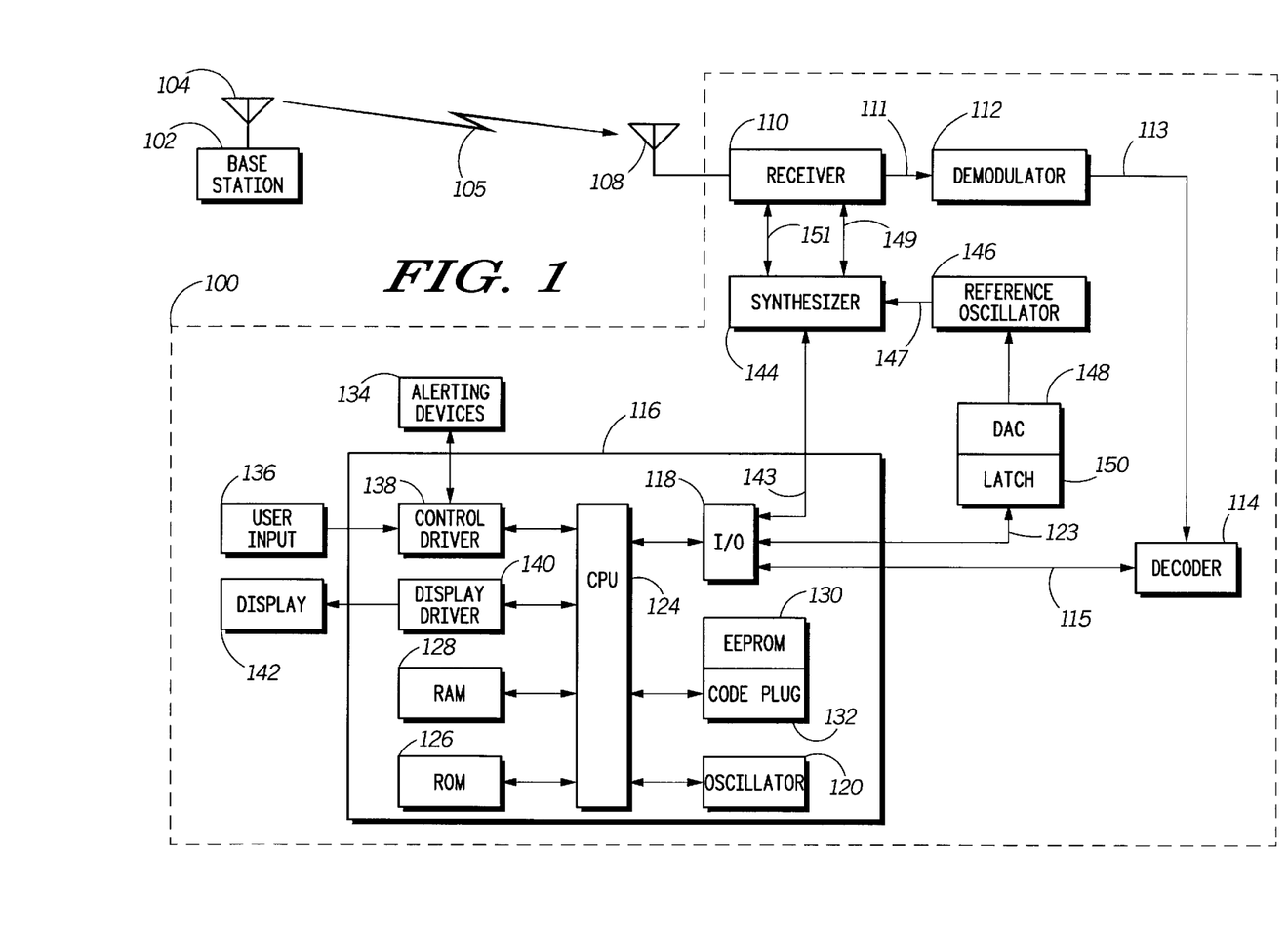
FIG. 1 is an electrical block diagram of a communication device in accordance with a preferred embodiment of the present invention.

FIG. 1 is an electrical block diagram of a communication device 100 in accordance with a preferred embodiment of the present invention. The communication device 100 receives information transmitted from a base station 102 over a predetermined channel 105 utilizing a signaling protocol that supports message delivery. One such protocol is the FLEX® signaling protocol as described in U.S. Pat. No. 5,625,351 issued Apr. 29, 1997, entitled "Message System Having Roaming Capability" which is assigned to the Assignee of the present invention, and which is incorporated by reference herein. The information transmitted over the predetermined channel 105 includes messages and control information and is intercepted by a receiving antenna 108 that delivers the received information to a receiver 110. The receiver 110 process the information received in a manner well known to one of ordinary skill in the art, providing at its output a base band signal 111 representative of the information received. The base band signal 111 is demodulated by demodulator 112 and provides at its output a demodulated data stream 113 that is representative of the information being transmitted. The demodulated data stream 113 is coupled to a decoder 114 for processing in a manner well known to one of ordinary skill in the art. As will be described further below, the information received includes among other things synchronization information, address information identifying a communication device 100 and message data directed to the communication device 100. The decoder 114 synchronizes with the synchronization information, allowing recovery of the address information and message data. The recovered address information and message data is coupled to a microcomputer controller 116 through an I/O port 118.

The receiver 110 is coupled to a frequency synthesizer 144 that generates a first oscillator frequency 151 and a second oscillator frequency 149 in a manner well known to one of ordinary skill in the art from a reference frequency 147 generated by a reference oscillator 146. The reference frequency 147 generated by the reference oscillator 146 is controlled via a DAC 148 (digital to analog converter), which converts frequency centering information stored in a binary format in a latch 150 to an analog signal output representative of the reference frequency to be generated. The frequency centering information is initially established at the time the communication device 100 is manufactured, and is periodically updated in accordance with the present invention as will be described below.

The microcomputer controller 116 is preferably an MC68HC05 microcomputer, such as manufactured by Motorola, Inc. of Schaumburg, Ill. The microcomputer controller 116 includes an oscillator 120 for generating timing signals that are utilized in the operation of the microcomputer controller 116. A crystal, or crystal oscillator (not shown) is coupled to the input of the oscillator 120 to provide a reference signal for establishing the microcomputer controller timing. A timer/counter, when provided, couples to the oscillator 120 and provides programmable timing functions that are utilized in controlling the operation of the receiver. A RAM 128 (random access memory) is utilized to store variables derived during processing, as well as to provide temporary storage of message information that is received during operation as a selective call messaging device. A ROM 126 (read only memory) stores the routines that control the operation of the receiver. It will be appreciated for many microcomputer controller implementations, a PROM (programmable read only memory) memory can be provided by an EEPROM 130 (electrically erasable programmable read only memory) to provide non-volatile storage of information. The EEPROM 130 typically includes a portion of memory set aside to store one or more addresses identifying the communication device 100, commonly referred to as a code plug 132. The oscillator 120, timer/ counter, RAM 128 and ROM 126 couple through an address/data/control bus (not shown) to the central processing unit (CPU) 124 which performs the instructions and controls the operations of the microcomputer controller 116.

The data recovered by the decoder 114 is coupled into the microcomputer controller 116 through an input/output port, I/O port 118, for processing. When the address information received is the same as address information stored in the code plug 132, the message data directed to the communication device 100 is stored in RAM 128, and the user is alerted to the receipt of a message via an alerting device 134, which can provide either an audible, tactile or visual alert, or a combination of audible, tactile and visual alerts. The message information is recovered for review via a user input 136. A control interface 138 interfaces the alerting device 134 and the user input 136 to the CPU 124 in a manner well known to one of ordinary skill in the art. Message information that is recalled from memory is displayed on a display 142, display such as an LCD (liquid crystal display), via a display driver 140 that couples to the CPU 124.

Figure 2:
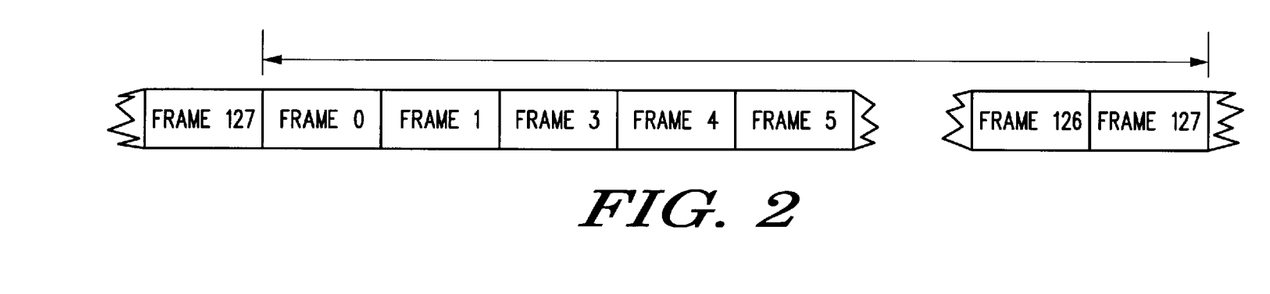
FIGS. 2, 3 and 4 are timing diagrams illustrating a communication protocol utilized with the communication device of FIG. 1.
Figure 3:
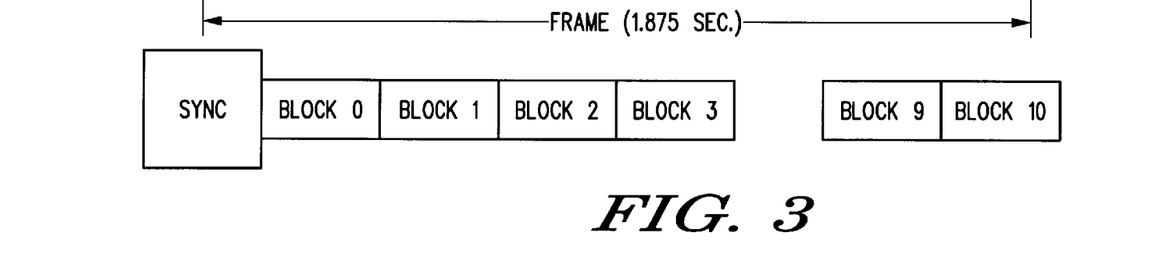
Figure 4:
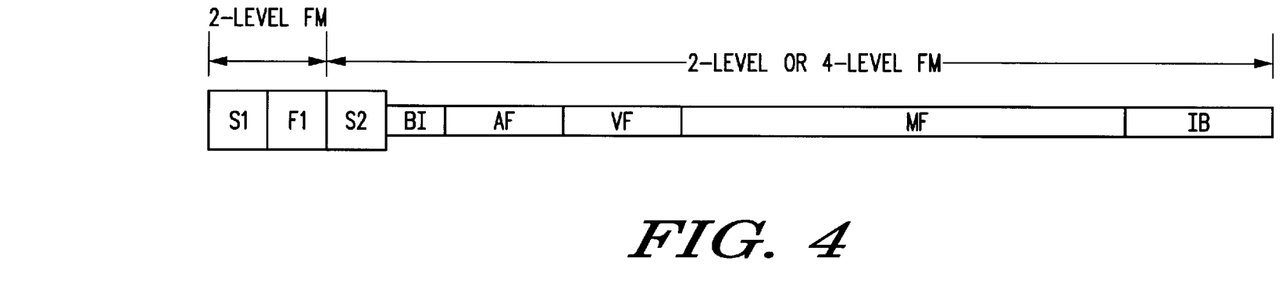

FIGS. 2, 3 and 4 are timing diagrams illustrating a communication protocol utilized with the communication device of FIG. 1. The communication protocol illustrated is provided by way of example, and is representative of the FLEX® signaling protocol such as described in U.S. Pat. No. 5,625,351 which issued Apr. 29, 1997 to Willard, et al., entitled "Messaging System having Roaming Capability", which is assigned to the assignee of the present invention, and which is incorporated by reference herein.

The FLEX signaling protocol, as shown in FIG. 2 comprises 128 frames, with each frame numbered 0 to 127. The frames are transmitted at 32 frames per minute, and thus a full 128 frame cycle lasts four minutes. One hour is divided into 15 cycles numbered 0 through 14. The protocol is a synchronous time slot protocol that can be tied to a universal time reference. Frame "0" is typically synchronized to the start of each hour so that the receiver can derive real time from the current frame and cycle number, thus providing the receiver accurate time within the hour with no need for adjustment.

Each frame comprises a sync portion (SYNC) followed by a number of blocks of data as shown in FIG. 3. The sync portion further comprises a Sync 1 portion (S1), a frame information (FI) word and a Sync 2 portion (S2), as shown in FIG. 4. The Sync 1 (S1) portion of each frame provides for frame timing, symbol timing and indicates the speed of transmission (i.e. 1600 bps, 3200, bps, or 6400 bps) of the remainder of the frame. The frame information (FI) word carries 11 bits for the frame and cycle numbers, 5 bits to indicate a time diversity system or in a conventional FLEX™ system, to indicate phases of low traffic, 1 bit called a Roaming Support Bit to indicate the presence of a frequency carrying roaming traffic and which is preferably GPS aligned to deliver messaging and other information. The Roaming Support Bit is used to trigger recognition of network roaming information. The Sync 2 (S2) portion provides for synchronization at the frame's block speed to allow for proper de-multiplexing and decoding of the blocks. A Block Information (BI) field is the first 1–4 words, called block information words, of the first interleaved block (B0) and contains frame and system structure information. The address field (AF) starts directly after the block information words and consists of short addresses and long addresses. A vector field (VF) maintains a 1 to 1 relationship with the address field. The vector word points to the start word of the associated message. The message field (MF) contains the message words specified by the vector field. IB represents idle blocks that are unused and are filled with appropriate idle bit patterns.

The information received in the FLEX signaling format is processed by communication device 100. The decoder 114 processes the recovered information from which is derived by way of example the following control information that is utilized to control decoding of address information and message data that is received, and can also be used to control channel switching when the communication device is capable of roaming.

RSR: "Re-synchronization Signal Received" is set when the decoder 114 detects a re-synchronization signal.

MS1: Missed Synchronization 1 is set when the decoder 114 fails to detect the first synchronization pattern S1 of a FLEX frame.

MFI: Missed Frame Information word is set when the frame information word is received with an uncorrectable number of errors.

MS2: Missed Synchronization 2 is set when the decoder 114 fails to detect the second synchronization pattern S2 of a frame.

MBI: Missed Block Information word 1 is set when at least one of the block information word ones is received with an uncorrectable number of errors. This bit is set no more than once per frame regardless of the number of missed block information word 1's in the frame MAW: Missed Address Word is set when any address word in the address field is received with an uncorrectable number of errors. This bit is set no more than once per frame regardless of the number of missed address words in the frame.

NBU: Network Bit Update is set when the NBC bit in the roaming control packet is set and a frame information word is received with a correctable number of errors. This bit will not be set when the frame information word is not received due to missing the first synchronization pattern S1.

n: Network bit value. When the NBU is set, this is the value of the n bit in the last received frame information word.

NDR: Noise Detect Result. These bits indicate the result of a noise detect.

| NDR | Noise Detect Result |
|-----|---------------------|
| 00  | No Information |
| 01  | Noise Detect was abandoned |
| 10  | FLEX signal detected |
| 11  | FLEX signal not detected |

In prior art communication devices, the decoder 114 automatically prompts the controller 116 to read a status packet when one or more of the RSR, MS1, MFI, MS2, MBI, MAW, NBU, $NDR_1$, or $NDR_0$, control bits is set. Prior art communication devices capable of scanning utilized the control bits delivered in the status packet to determine whether to remain on a channel or whether to begin scanning for a new channel. All communication devices, whether capable of roaming or not, utilize the status packet information 115 to determine when the data being received is being received correctly. For purposes of information, the status packet structure is shown in Table 1 below.

Status Packet Bit Assignments

| | Bit 7 | Bit 6 | Bit 5 | Bit 4 | Bit 3 | Bit 2 | Bit 1 | Bit 0 |
|---|---|---|---|---|---|---|---|---|
| Byte 3 | 0 | 1 | 1 | 0 | 0 | 0 | 0 | 0 |
| Byte 2 | RSR | MS1 | MFI | MS2 | MBI | MAW | NBU | n |
| Byte 1 | x | x | x | x | x | x | $NDR_1$ | $NDR_0$ |
| Byte 0 | x | x | x | x | SCU | $RSC_2$ | $RSC_1$ | $RSC_0$ |

In the preferred embodiment of the present invention, the status packet information 115 is used to control address and data decoding, roaming operation, and can also be advantageously utilized to provide channel quality information to provide channel based oscillator aging compensation, as will be described in detail below.

Figure 5:
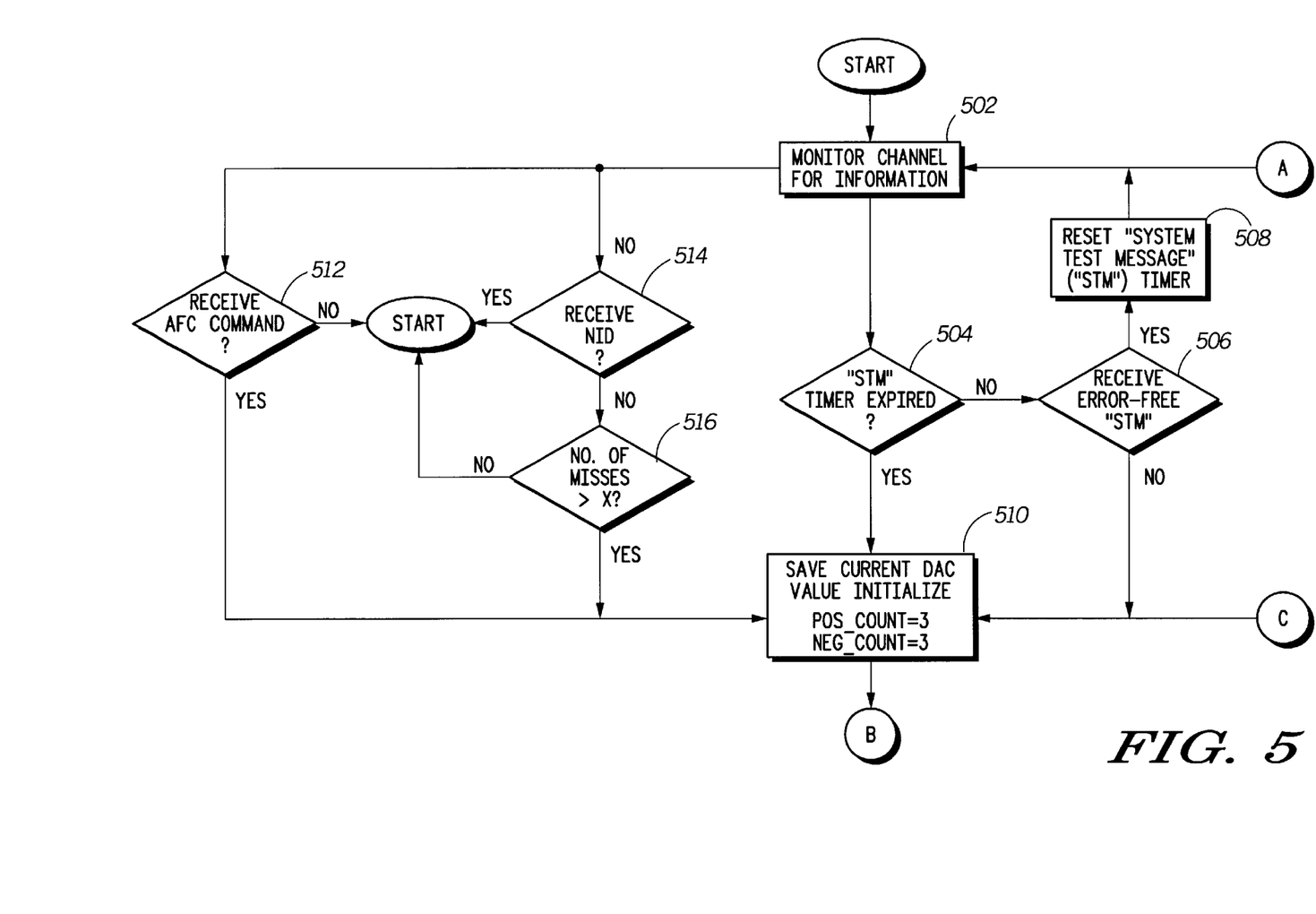
FIG. 5 is a flow chart illustrating methods by which channel based oscillator aging compensation is initiated.

FIG. 5 is a flow chart 500 illustrating several methods by which oscillator aging compensation is initiated in accordance with the present invention. The controller 116 monitors the output of the decoder 114, at step 502, for changes in the status packet information 115 which can be utilized to determine when oscillator aging compensation is to be performed. In a first embodiment of the present invention, a system test message (STM) is generated periodically by the system to provide a check of channel signal quality. In a second embodiment of the present invention, channel signal quality information is continuously being provided by the status packet information 115 for each frame of information being transmitted. In a third embodiment of the present invention, the presence or absence of a network ID (NID) is used to initiate oscillator compensation. And in a fourth embodiment of the present invention, an automatic frequency control (AFC) command sent over the channel 105 is used to initiate oscillator compensation. The first three methods can be advantageously utilized by the communication device 100 to determine whether the reference oscillator 146 has drifted as will be described below. The fourth method presumes drift has occurred over a predetermined period of time, and prior to the oscillator drift becoming excessive, oscillator compensation is initiated. Excessive drift of the reference oscillator 146 can result in a loss of ability to properly decode the information that is received over the channel 105, thus making the communication device 100 inoperative. It will be appreciated that the methods by which oscillator compensation is initiated, as described above, can be implemented independently, or can be implemented in combination.

In accordance with the first embodiment of the present invention, an STM is generated, by way of example, at least once daily, although it will be appreciated, as oscillator aging occurs over a relatively long period of time, such as a time interval of one year, a user can predetermine a longer period of time for monitoring of the STM, such as at time intervals of one or more times weekly. The interval of time between which the STM is generated is established within the communication system, and is controlled within the communication device 100 using a system test message timer 726, to be described below.

Returning to FIG. 5, in accordance with the first embodiment of the present invention, when a STM transmission is provided within the communication system to implement oscillator aging compensation, the system test message timer 726 has not timed out, at step 504, and a STM is received error free, at step 506, the system test message timer 726 is reset, at step 508, after which the channel is again monitored for information, at step 502. When the system test message timer 726 has not timed out, at step 504, and a STM is received with errors, at step 506, the current DAC values are saved, at step 510, and the positive and negative counters are initialized to POS_COUNT=3 and NEG_COUNT=3, respectively. Program execution moves to step 602 as will be described below.

When the system test message timer 726 has expired, at step 504, prior to a valid STM being received, at step 506, the current DAC values are saved, at step 510, and the positive and negative counters are initialized to POS_COUNT=3 and NEG_COUNT=3, respectively. Program execution moves to step 602 as will be described below.

The second embodiment of the present invention by which oscillator aging compensation is based on continuously monitoring the channel signal quality will be described in detail below.

In accordance with the third embodiment of the present invention, when the system within which the communication device is operating provides a network ID (NID) which is utilized by communication devices which roam, and a network ID (NID) is received at a prescribed transmission time interval, at step 514, program execution returns to step 502. When the transmission of a NID is not received at the prescribed transmission time, at step 514, the number of missed NID transmissions is monitored at step 516. When the number of missed NID transmissions is less than a predetermined number of transmissions, X, at step 516, program execution returns to step 502. When the number of missed NID transmissions is equal to or greater than the predetermined number of transmissions, at step 516, the current DAC values are saved, at step 510, and the positive and negative counters are initialized to POS_COUNT=3 and NEG_COUNT=3, respectively. Program execution moves to step 602.

As described above oscillator compensation can also be initiated by a command received over the channel 105. In accordance with the fourth embodiment of the present invention, when the information received over the channel 105 includes an AFC command, at step 512, the current DAC values are saved, at step 510, and the positive and negative counters are initialized to POS_COUNT=3 and NEG_COUNT=3, respectively. Program execution moves to step 602. When the AFC command has not been received, at step 512, program execution returns to step 502. Once the current value of the DAC is save and the positive and negative counters have been initialized, at step 510, program execution moves to step 602 of FIG. 6 which is a flow chart illustrating the method by which channel based oscillator aging compensation is achieved.

In accordance with the present invention, compensation of the reference oscillator 146 is advantageously achieved by monitoring channel quality information derived from information transmitted on the channel 105, over a predetermined period of time, making adjustments to the frequency of the reference oscillator 146 in predefined steps, and when the resultant channel quality values obtained exceed values stored within the communication device 100, returning to monitor the long term aging of the reference oscillator 146.

Figure 6:
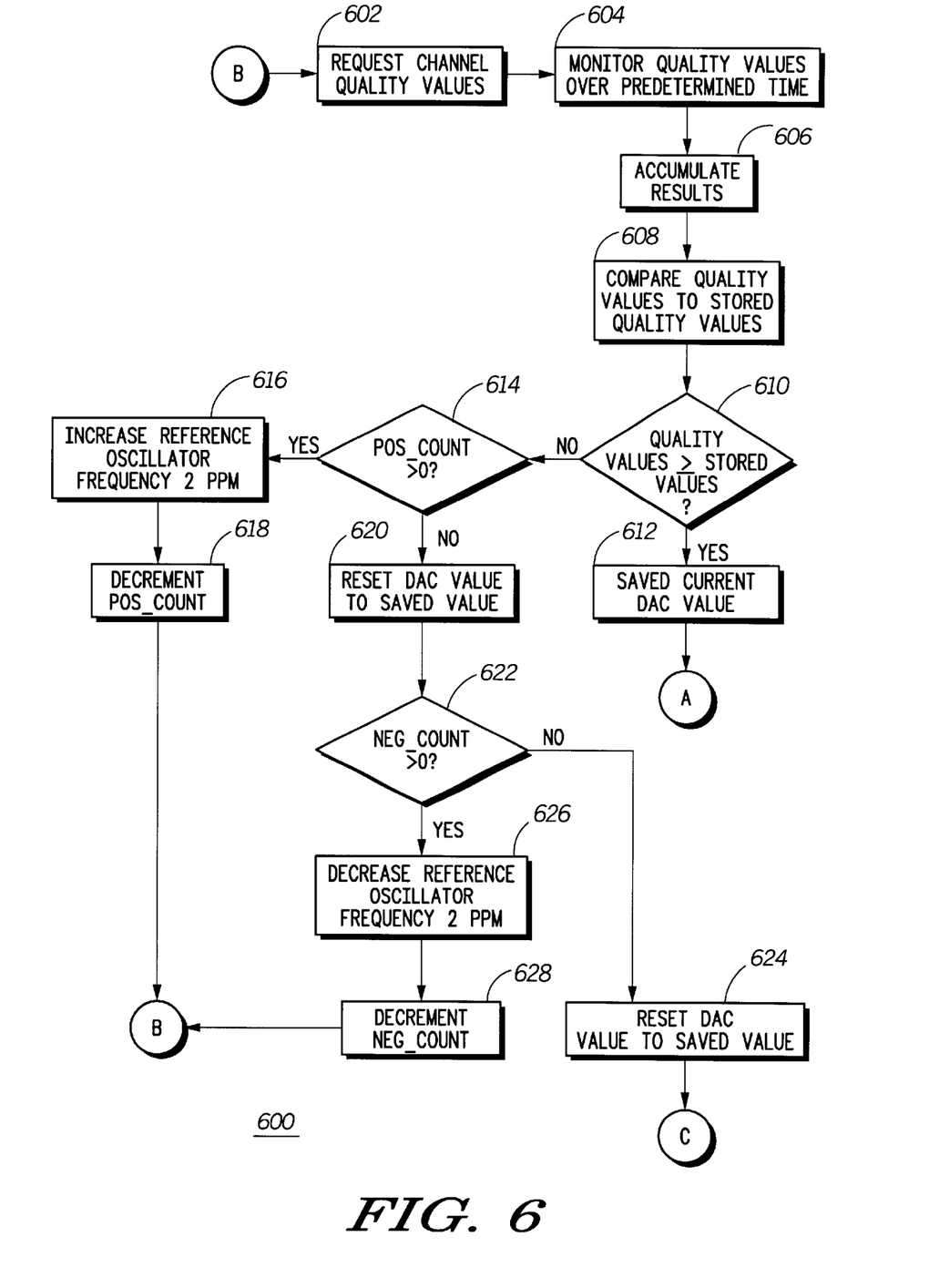
FIG. 6 is a flow chart illustrating a method of channel based oscillator aging compensation.

At step 602, the controller 116 requests the status packet to be downloaded from the decoder 114 to the controller 116 in the packet. The status packet includes control information that represents channel quality values that have been derived by the decoder 114. The channel quality values are derived from the control information generated by the decoder 114, i.e. the MS1—Missed Synchronization 1 control bit value, MFI—Missed Frame Information word control bit value, MS2—Missed Synchronization 2 control bit value, MBI—

Missed Block Information word 1 control bit value, MAW—Missed Address Word control bit values, or NDR—Noise Detect Result control bit values. The channel quality values are monitored over a predetermined period of time, at step 604, such as a period of 30 minutes. The channel quality values, as they are received from the decoder 114, are accumulated, at step 606, and reception probabilities computed. At the end of the predetermined period of time, the reception probabilities based on one or more of the quality values being monitored are compared to stored reception probabilities, at step 608. When the computed reception probabilities are greater than stored reception probabilities, at step 610, the current DAC value is stored, at step 612, after which program execution returns to step 502. When the computed reception probabilities are less than the stored reception probabilities, at step 610, the positive counter count is checked whether it is greater than zero, at step 614. When the positive counter count is greater than zero, at step 614, the reference oscillator frequency is increased 2 ppm (parts per million), at step 616. The positive counter value is than decremented by one, at step 618. Program execution returns to step 602, as described above.

When the positive counter value is not greater than zero, at step 614, the DAC value is reset to the saved value, at step 620. The negative counter value is than checked whether it is greater than zero, at step 622. When the negative counter value is not greater than zero, at step 622, the oscillator tuning value is reset to the stored value, at step 624. When the negative counter value is greater than zero, at step 622, the reference oscillator frequency is decreased by 2 ppm, at step 626. The negative counter value is than decremented by one, at step 628. Program execution returns to step 602, as described above.

When both the positive counter value, at step 614 and the negative counter value, at step 622, are not greater than zero, the adjustments made to the reference oscillator 146 have not effected sufficient improvement in the signal reception, and as a result, the stored oscillator tuning value is reset, at step 624, and the process described above is repeated.

It will be appreciated from the tuning process described above, monitoring of the reference oscillator frequency can also be performed continuously over the operational life of the communication device 100 by performing step 510 through step 624, and bypassing the necessity of the communication device 100 to monitor the channel 105 for the transmission of system test messages, AFC commands, or NIDs. Monitoring of the reference oscillator frequency can also be periodically monitored over the operational life of the communication device 100 by following the steps of the flow charts illustrated in FIG. 5 and FIG. 6, in which case the communication device 100 periodically monitors for the transmission of system test messages, AFC commands, or NIDs. In particular, system test messages represent predetermined messages that must be received during a predetermined period of time, and when the system test message is not received periodically within the predetermined period of time, adjustment of the reference oscillator frequency in the manner described above is initiated.

In summary, a method for compensating the frequency of a reference oscillator 146 that has been preset to a frequency required to establish reception of information on a predetermined channel 105 by a communication device 100, is described above. The method includes the steps of monitoring channel quality by deriving channel quality information from information received on the predetermined channel 105, the channel quality information derived being representative of oscillator frequency variation; and adjusting the frequency of the reference oscillator 146 in a manner as required to compensate for the oscillator frequency variation in accordance with the channel quality information derived. The channel quality information that is derived is expressed as a value which is compared to channel quality information which is stored and expressed as a value. The frequency of the reference oscillator 146 is adjusted to compensate for oscillator frequency variation when the value of the channel quality information derived is less than the value of the channel quality information which is stored.

Figure 7:
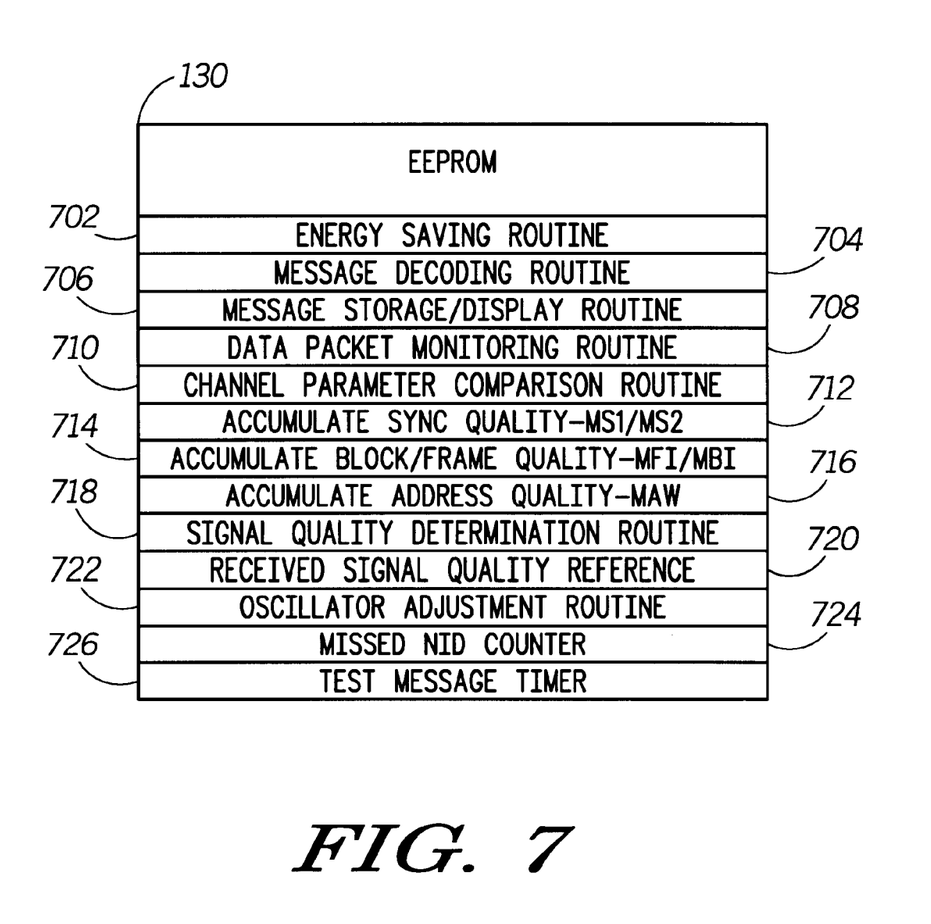
FIG. 7 is a diagram illustrating routines invoked in the communication device of FIG. 1.

FIG. 7 is a diagram illustrating routines invoked in the communication device of FIG. 1. The routines that control the operation of the communication device 100 are stored within the EEPROM 130 or ROM 126. These routines include such conventional routines as an energy saving routine 702, message decoding routine 704, and message storage and display routine 706. The energy saving routine 702 controls the energy conservation, or battery saving operation of the communication device 100 in a manner well known to one of ordinary skill in the art. The message decoding routine controls the decoding of the address information and message information in a manner well known to one of ordinary skill in the art. The message storage and display routine controls the storage of messages which have been received, and the recovery of such messages for display in a manner well known to one of ordinary skill in the art.

The EEPROM 130 also includes routines for monitoring data packet reception 708, and channel parameter comparison routines 710. These routines enable the communication device to, among other things, determine when it is on an active channel, and when to select another channel when the communication device 100 is no longer in contact with the communication system to which it was earlier in communication, such as when the communication device 100 is capable of roaming and roams from one system to another. Additional routines enable the controller 116 to accumulate and determine reception probabilities for sync quality information 712, accumulate and determine reception probabilities for block and frame quality information 714, and accumulate and determine reception probabilities for address quality information 716. The accumulation of sync quality information, block and frame quality information and address quality information is performed over a predetermined period of time, such as a one hour time interval. Accumulation of this information over shorter periods of time would compromise the operation of the communication device 100, as the communication device can be moving into and out of areas of adequate signal reception. Additional routines include a signal quality determination routine 718, which evaluates one or more of the accumulated values described above, to determine in the short term whether channel switching to accommodate roaming is required for a communication device 100 capable of roaming, or oscillator aging compensation based on the quality of received channel information is required. The EEPROM 130 also includes signal quality reference values 720 that are used to trigger channel based oscillator aging compensation. The EEPROM 130 also includes an oscillator adjustment routine 722 corresponding to the flow charts of FIG. 5 and FIG. 6. It will be appreciated that other routines to control other functions can be included in the EEPROM 130. Other routines, such as a missed NID counter routine 724 and a system test message timer routine 726 are provided to implement some of the timing considerations required to determined when channel based oscillator aging compensation is required. It will also be appreciated that these routines can also be enabled in other storage devices such as programmable read only memories (PROMs), flash memory, or other similar non-volatile storage medium.

While specific embodiments of this invention have been shown and described, further modifications and improvements will occur to those skilled in the art. All modifications that retain the basic underlying principles disclosed and claimed herein are with the scope and spirit of the present invention.

We claim:

1. A method, in a communication device, for compensating the frequency of an oscillator which has been preset to a frequency required to establish reception of information on a predetermined channel, said method comprising:

processing the information received on the predetermined channel to create a status packet;

monitoring the predetermined channel for initiation of oscillator compensation information;

initiating oscillator compensation when the initiation of oscillator compensation information is determined;

deriving channel quality information from the status packet to create a derived channel quality information value;

comparing the derived channel quality information value with a stored channel quality information value; and adjusting the frequency of the oscillator in a manner as required to compensate for the oscillator frequency variation in accordance with the channel quality information derived.

2. The method for compensating the frequency of an oscillator according to claim 1, wherein the step of adjusting comprises:

adjusting the frequency of the oscillator to compensate for oscillator frequency variation when the derived channel quality information value is less than the stored channel quality information value.

3. The method for compensating the frequency of an oscillator according to claim 2, wherein the initiation of oscillator compensation information comprises:

failing to receive a predetermined message within a predetermined period of time determined by a user on the predetermined channel.

4. The method for compensating the frequency of an oscillator according to claim 2, wherein the initiation of oscillator compensation information comprises:

receiving a predetermined command on the predetermined channel.

5. The method for compensating the frequency of an oscillator according to claim 2, wherein the initiation of oscillator compensation information comprises:

failing to receive a predetermined message at a prescribed transmission time interval a predetermined number of times.

6. The method for compensating the frequency of an oscillator according to claim 2, wherein the initiation of oscillator compensation information comprises:

receiving information on the predetermined channel.

7. The method for compensating the frequency of an oscillator according to claim 1, wherein the information received on the predetermined channel is transmitted predetermined message information.

8. The method for compensating the frequency of an oscillator according to claim 7, wherein the transmitted predetermined message information is transmitted periodically.

9. The method for compensating the frequency of an oscillator according to claim 1, wherein the information received on the predetermined channel includes synchronization information, and wherein the status packet is representative of the communication device being able to synchronize to the synchronization information.

10. The method for compensating the frequency of an oscillator according to claim 1, wherein the information received on the predetermined channel includes block information, and wherein the status packet is representative of the communication device being able to recover the block information.

11. The method for compensating the frequency of an oscillator according to claim 1, wherein the information received on the predetermined channel includes address information, and wherein the status packet is representative of the communication device being able to recover the address information.

12. The method for compensating the frequency of an oscillator according to claim 1, wherein the step of deriving comprises:

obtaining multiple status packets and monitoring the multiple status packets over a predetermined period of time.

13. A communication device, comprising:

a receiver for receiving message information transmitted on a predetermined channel;

an oscillator having an operating frequency set by a controller which enables reception of the message information on the predetermined channel; and a decoder for decoding the message information received, and for deriving message data and status packet information from the message information, said controller being responsive to the message data derived, for storing the same, and further responsive to the status packet information derived for creating channel quality information, and for generating a compensation signal when the value of the channel quality information exceeds a predetermined value of the channel quality information which is stored, wherein the compensation signal being generated by said controller effects shifting the frequency of operation of said oscillator to center reception of said communication device on the predetermined channel.

14. The communication device according to claim 13, wherein channel quality is continuously monitored, and wherein the frequency of said oscillator is adjusted when the value of the channel quality information derived exceeds the value of the channel quality information which is stored.

15. The communication device according to claim 13, wherein the channel quality is periodically monitored, and wherein the frequency of said oscillator is adjusted when the value of the channel quality information derived exceeds the value of the channel quality information which is stored.

16. The communication device according to claim 13, wherein predetermined message information is transmitted which enables deriving the channel quality information.

17. The communication device according to claim 16, wherein the predetermined message information is transmitted periodically.

18. The communication device according to claim 13, wherein the message information is transmitted in a protocol which includes a synchronization word, and wherein the channel quality information derived is representative of the communication device being able to synchronize to the synchronization word.

19. The communication device according to claim 13, wherein the message information is transmitted in a protocol which includes a block information word, and wherein the channel quality information derived is representative of the communication device being able to recover the block information word.

20. The communication device according to claim 13, wherein the message information is transmitted in a protocol which includes an address word, and wherein the channel quality information derived is representative of the communication device being able to recover the address word.

21. The communication device according to claim 20, wherein the channel quality information provides a measurement of frequency variation of said oscillator occurring over an extended period of time.

22. A communication device having channel based oscillator compensation, comprising:

an oscillator programmed to an operating frequency corresponding to a radio frequency channel;

a decoder for decoding message information received on the radio frequency channel, and for deriving from the message information, message data and status packet information; and a controller, responsive to the status packet information to create a channel quality information value, for generating a compensation signal adjusting the operating frequency of said local oscillator when the channel quality information value exceeds a predetermined limit.

* * * * *